United States Patent
Hong et al.

(10) Patent No.: US 10,498,355 B2
(45) Date of Patent: Dec. 3, 2019

(54) SEARCHABLE, STREAMING TEXT COMPRESSION AND DECOMPRESSION USING A DICTIONARY

(71) Applicant: EMC Corporation, Hopkinton, MA (US)

(72) Inventors: Yuan Hong, Shanghai (CN); Shenjun Zhang, Shanghai (CN); Randy Yujia Wang, Shanghai (CN); Zhendong Li, Shanghai (CN); Deborah Xia Liu, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 90 days.

(21) Appl. No.: 14/979,727

(22) Filed: Dec. 28, 2015

(65) Prior Publication Data

US 2016/0197621 A1 Jul. 7, 2016

(30) Foreign Application Priority Data

Jan. 4, 2015 (CN) .......................... 2015 1 0003759

(51) Int. Cl.
*H03M 7/30* (2006.01)
*G06F 17/22* (2006.01)

(52) U.S. Cl.
CPC ...... *H03M 7/3088* (2013.01); *G06F 17/2217* (2013.01); *H03M 7/30* (2013.01); *H03M 7/3084* (2013.01); *H03M 7/6005* (2013.01)

(58) Field of Classification Search
CPC .......................... H03M 7/3084; H03M 7/3088
See application file for complete search history.

(56) References Cited

U.S. PATENT DOCUMENTS

| | | | |
|---|---|---|---|
| 4,843,389 A | 6/1989 | Lisle | |
| 5,737,733 A * | 4/1998 | Eller | G06F 17/30657 707/708 |
| 5,893,102 A * | 4/1999 | Maimone | G06F 17/30595 |
| 5,991,713 A * | 11/1999 | Unger | H03M 7/3084 704/1 |
| 7,574,719 B1 * | 8/2009 | Shield | H04N 21/235 725/39 |
| 2002/0152219 A1 * | 10/2002 | Singh | H04L 69/04 |

(Continued)

FOREIGN PATENT DOCUMENTS

| CN | 101350624 | 1/2009 |
|---|---|---|
| CN | 101729075 | 6/2010 |

OTHER PUBLICATIONS

Microsoft Computer Dictionary 499 (5th ed. Microsoft Press 2002).*

(Continued)

*Primary Examiner* — Asher D Kells
(74) *Attorney, Agent, or Firm* — BainwoodHuang

(57) ABSTRACT

The present disclosure provides methods, computer program products and apparatuses for text compression and decompression wherein a desired compression ratio may be obtained, and the compressed content per se is still in a searchable text form, thereby providing a possibility for searching without decompression and significantly saving storage space and enhancing search efficiency, and in turn, reducing the total cost ownership TCO and providing a better user experience.

10 Claims, 9 Drawing Sheets

(56) References Cited

U.S. PATENT DOCUMENTS

| | | | | |
|---|---|---|---|---|
| 2003/0030575 A1* | 2/2003 | Frachtenberg | ...... | H03M 7/3088 341/51 |
| 2003/0141993 A1* | 7/2003 | Baldwin | ................ | H03M 7/30 341/50 |
| 2004/0199931 A1* | 10/2004 | Kumar | ...................... | G06F 7/02 725/19 |
| 2004/0225497 A1* | 11/2004 | Callahan | ............. | H03M 7/3084 704/235 |
| 2005/0027731 A1* | 2/2005 | Revel | ...................... | H04L 69/04 |
| 2008/0036630 A1* | 2/2008 | Lee | .................... | H03M 7/3084 341/51 |
| 2012/0296983 A1* | 11/2012 | Boehm | .............. | H03M 7/3088 709/206 |
| 2013/0103982 A1* | 4/2013 | Chelliah | ............ | H03M 7/3088 714/20 |
| 2018/0101580 A1* | 4/2018 | Kataoka | ............ | G06F 17/30533 |

OTHER PUBLICATIONS

Ho Meng-Hang, Hsu-Chun Yen, "A dictionary-based compressed pattern matching algorithm", Computer Software and Applications Conference 2002. COMPSAC 2002. Proceedings. 26th Annual International, 2002.*

* cited by examiner

```
$!,TIME@@HH:mm:ss.SSS
$",Using cached AUTHORIZATION references of TENANT 501c1e50-3e36-4d89-afde-ed7ef5f91b41
$#,Using envrionment configuration from context
$$,Using cached IDENTITYPROVIDER references of TENANT 501c1e50-3e36-4d89-afde-ed7ef5f91b41
$%,Using cached LIBRARY references of SPACE 5601ad30-5df2-4e15-976a-244d1d150e2b
$&,Using Cached ACCESSDEFINITION references of SPACE 5601ad30-5df2-4e15-976a-244d1d150e2b
$'.Using cached LIBRARY references of SPACE ce86331f-a952-4441-9c34-c5d9b3c0d850
$(,5601ad30-5df2-4e15-976a-244d1d150e2b
$),TIME@@yyyy-MM-dd HH:mm:ss.SSSS 'UTC'
$*, identifiers.emc.com
$+,identifiers.emc
```

SEARCHABLE, STREAMING TEXT COMPRESSION AND DECOMPRESSION USING A DICTIONARY

RELATED APPLICATION

This application claim priority from Chinese Patent Application Number CN201510003759.X, filed on Jan. 4, 2015 at the State Intellectual Property Office, China, titled "METHOD AND APPARATUS FOR TEXT COMPRESSION AND DECOMPRESSION," the contents of which is herein incorporated by reference in entirety.

TECHNICAL FIELD

Embodiments of the present disclosure relate to data compression.

BACKGROUND

Generally, in a large software system such as software as a service (SaaS) and a large-scale distribution system, mass log messages may be generated each day for different purposes such as system monitoring, user behavior recording, and troubleshooting, etc. Typically, such log data may be generated at a very high throughput which may usually reach, for example, 10 GB per hour, and such log traffic may occupy a considerable I/O capacity and very likely become a bottleneck for system performance.

SUMMARY OF THE INVENTION

Example embodiment of present disclosure provides a technical solution for text compression and decompression receiving text data; searching a compressible text item in the text data based on a text dictionary, wherein the text dictionary includes a plurality of key value pairs, each of which includes a text compression value and a corresponding compressible text items, and wherein the text compression value has a length shorter than the compressible text item; and replacing the searched compressible text item in the text data with a corresponding text compression value so as to compress the text data.

BRIEF DESCRIPTION OF THE DRAWINGS

The features, advantages and other aspects of the present disclosure will become more apparent through detailed explanation on the embodiments as illustrated in the embodiments with reference to the accompanying drawings, wherein:

FIG. 3 schematically shows a diagram of a part of an exemplary text dictionary according to one embodiment of the present disclosure;

FIG. 4 schematically shows a diagram of an exemplary compressed text data according to one embodiment of the present disclosure;

DETAILED DESCRIPTION

Figure 1:
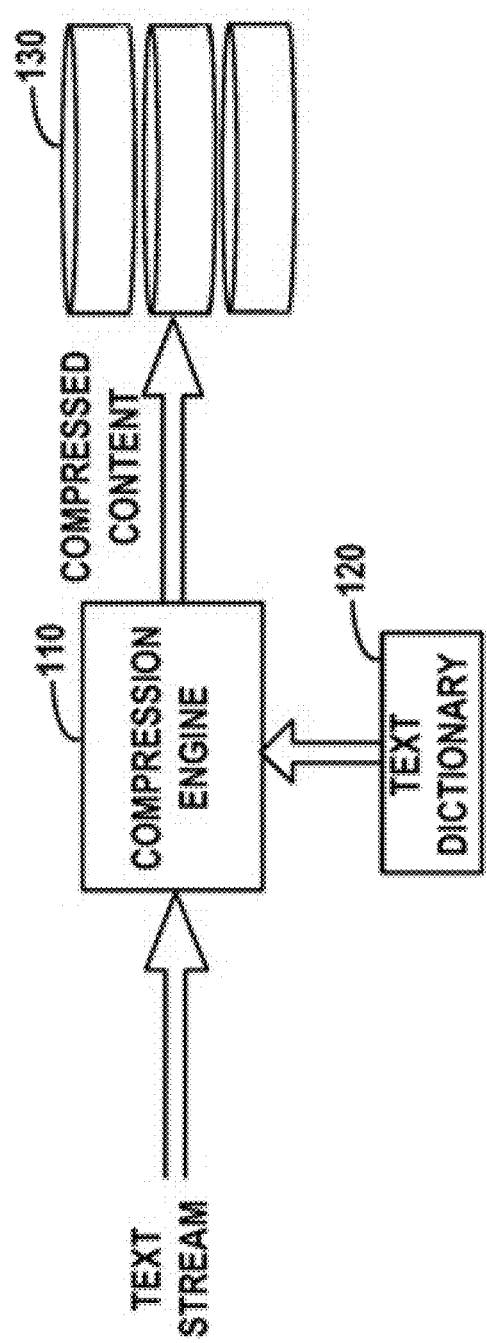
FIG. 1 schematically shows a block diagram of text data compression according to one exemplary embodiment of the present disclosure.

Hereinafter, various exemplary embodiments of the present disclosure will be described with reference to the accompanying drawings. It should be noted that all of these drawings and description are only presented as exemplary preferred embodiments. It is to note that based on the subsequent description, one can easily conceive alternative embodiments of the structure and method disclosed herein, and such alternative embodiments may be used without departing from the principle of the disclosure as claimed in the present disclosure.

It would be appreciated that these exemplary embodiments are provided only for enabling those skilled in the art to better understand and then further implement the present disclosure, not intended to limit the scope of the present disclosure in any manner. Besides, in the drawings, for a purpose of illustration, optional steps, modules, and units are illustrated in dotted-line blocks.

The terms "comprise(s)," "include(s)", their derivatives and like expressions used herein should be understood to be open, i.e., "comprising/including, but not limited to." The term "based on" means "at least in part based on." The term "one embodiment" means "at least one embodiment"; and the term "another embodiment" indicates "at least one further embodiment." Relevant definitions of other terms will be provided in the description below.

Hereinafter, a solution for compressing and decompressing text data according to the embodiments of the present disclosure will be described in detail through embodiments with reference to the accompanying drawings.

In some embodiment, in order to improve system performance, a system administrator may usually need to close a log recording function or lower a fineness of log records, e.g., not recording logs, or only recording logs when errors occur, while neglecting log information related to daily operations, which may result in forfeiting details of log information for system performance enhancement. In a further embodiment, due to lack of detailed log information, additional difficulties may be caused when it is required to identify and track a system problem.

In a further embodiment, for sake of fault diagnosis and the like, it may be desired to record complete log information. In a further embodiment, this may require configuring a mass storage space in a file system or in a system analytical tool. In an example embodiment, in case of providing a storage space in a file system, a log file may be usually compressed into a binary file so as to save storage space. In a further embodiment, it may be known that a binary compression file may be unsearchable; therefore, when performing log analysis, it may be needed to decompress the compression file before performing analytic work. In a further embodiment, if a log file size is relatively large, decompression per se may take a rather long time. In a further embodiment, it may be required to manage an extra storage space for a decompressed file. In an additional embodiment, because a binary compression file may not be searchable, a log analysis tool for storing and analyzing logs may usually have to store uncompressed raw materials. In a further embodiment, due to a large data mount, there may be a further problem that the log analysis tool may also need a mass storage space and have low search efficiency.

In a further embodiment, in the existing text compression solution, a binary manner for compression may be employed, which incurs a massive storage space demand and a degraded search efficiency. In a further embodiment, there may be provided a novel solution for compressing and decompressing text data.

In one embodiment, text contents such as logs may include contents appearing with a high frequency (or called repetitive contents), such as various standard statements, modes inherent to the used programming language, fixed formats for a text type, etc. In an example embodiment, log records may generally have a same statement format for information of the same type. In another example embodiment, a programming language such as Java language may usually have fixed packets and class names, and log data such as xml file may also have a fixed format. In a further embodiment, for an already released system, such information may be usually substantially fixed. In a further embodiment, some new log information may be added later, the overall structure may in general not change. In a further embodiment, outputs of text data such as logs may be usually concentrated in a narrow space, e.g., concentrated at a streamhandler "streamhandler" of a Java logging packet of Java application.

In a further embodiment, it may be possible to process massive text data concentrically. In a particular embodiment, shorter text characters may be supposedly used to replace these statements, patterns, and formats that repetitively appear for multiple times. In a further embodiment, a size of text data may be significantly reduced, while searchability of text data may still be maintained.

Example embodiments of the present disclosure provide a solution for text compression and decompression. One embodiment may include receiving text data. A further embodiment may include searching a compressible text item in a text data based on a text dictionary, wherein the text dictionary includes a plurality of key value pairs, each of which may include a text compression value and a corresponding compressible text items. In a further embodiment a text compression value may have a length shorter than a compressible text item, a further embodiment may include replacing a searched compressible text item in a text data with a corresponding text compression value so as to compress a text data.

One embodiment may include a method for compressing text data. In a further embodiment, the method may include receiving text data. A further embodiment may include searching a compressible text item in a text data based on a text dictionary, wherein the text dictionary includes a plurality of key value pairs, each of which includes a text compression value and a corresponding compressible text items. A further embodiment may include a text compression value that may have a length shorter than a compressible text item. A further embodiment may include replacing a searched compressible text item in a text data with a corresponding text compression value so as to compress the text data.

In a further embodiment a text dictionary may be selected from a plurality of text dictionaries corresponding to a plurality of different types of text data based on a type of the text data. In another embodiment, a text dictionary may have version information. In a further embodiment the method may include labelling a compressed text data with compression version information identical to version information of the text dictionary. In a further embodiment, a text dictionary may be established by extracting high-frequency appearance information from a plurality of sample text data. In a further embodiment, a compressible text item may include one or more of a statement frequently appearing in text data, a pattern inherent to a used programming language, and a fixed format of text type. In a further embodiment, a compressible text item included in a key value pair of the text dictionary may have a length longer than a predetermined value.

In a further embodiment, a key value pair of a text dictionary may include any one of an upper-case letter, a lower-case letter, a number, and a symbol and a combination thereof, wherein a length of the text compression value might not exceed a predetermined value. In yet a further embodiment, a text dictionary may have a predetermined size, wherein a compressible text item in a text dictionary may be determined based on a weight of the text item which may be determined at least based on a length of a text item and its appearing frequency. In another embodiment, a text data may be log data in a form of text stream. In a further embodiment, a text data may be a text search request, including a compressed text item, for a compressed file. In a further embodiment, a text search request may be compressed using a text dictionary corresponding to a type and version information of a compressed file which a text search request is directed towards.

In one embodiment a method may include decompressing a compressed text data. In a further embodiment, the method may include receiving compressed text data. A further embodiment may include searching a text compression value in a compressed text data based on a text dictionary, wherein the text dictionary includes a plurality of key value pairs, each of which includes a text compressed value and a corresponding compressible text item. In a further embodiment a text compression value may have a length shorter than a compressible text item. A further embodiment may include replacing a searched text compression value in a compressed text data with a corresponding compressible text item, so as to decompress text data.

According to another embodiment, an apparatus for compressing text data may be provided. In a further embodiment, the apparatus may include a text data receiving module configured to receive text data. A further embodiment may include a text item searching module configured to search a compressible text item in a text data based on a text dictionary, wherein the text dictionary includes a plurality of key value pairs, each of which includes a text compression value and a corresponding compressible text items. In a further embodiment, a text compression value may have a length shorter than a compressible text item. A further embodiment may include a text item replacing module configured to replace a searched compressible text item in a text data with a corresponding text compression value so as to compress the text data.

According to one embodiment, an apparatus for decompressing a compressed text data may be provided. In a further embodiment the apparatus may include, a compressed data receiving module configured to receive compressed text data. A further embodiment may include a compression value searching module configured to search a text compression value in the compressed text data, wherein the text dictionary includes a plurality of key value pairs, each of which includes a text compressed value and a corresponding compressible text item. In a further embodiment, a text compression value may have a length shorter than a compressible text item. In a further embodiment, a compression value replacing module may be configured to replace a searched text compression value in a compressed text data with a corresponding compressible text item, so as to decompress the text data.

According to a further embodiment, a computer program product having a program code embodied thereon, which, when being executed on a processor, may cause the processor to perform a method for compressing text data as disclosed above. According to a further embodiment, a computer program product having a program code embodied thereon, which, when being executed on a processor, may cause the processor to perform a method for decompressing text data as disclosed above.

In the embodiments of the present disclosure, there may be an improved solution of compressing and decompressing text data. In a further embodiment, according to this solution, a compressible text item in the text data may be replaced with a corresponding text compression value to perform text compression, instead of using an unsearchable binary compression manner. In a further embodiment, it may not only obtain a desired compression ratio, but also a compressed content per se may still be in a searchable text form. In a further embodiment, when performing a query, a compressible text item in a query request may be likewise compressed into a text compression value with which a compressed file may be searched without decompressing the compressed file. In a further embodiment, a storage space may be significantly saved and search efficiency may be greatly enhanced. In a further embodiment, a solution according to the present disclosure may not only reduce a total cost ownership (TCO), but also may provide a better experience to the user.

FIG. 1 schematically shows a block diagram of text data compression according to one exemplary embodiment of the present disclosure. As shown in the architecture of FIG. 1, architecture 100 for the text compression mainly involves compression engine 110 and a text dictionary 120. Compression engine 110 receives an incoming text stream, and compresses the text stream based on text dictionary 120. The compressed content is stored in storage device 130 such as a database.

Text dictionary 120 is a mapping structure including a considerable number of key value pairs, i.e., pairs comprising compressible text items and corresponding text compression values. Detailed information of the text dictionary will be described below.

Figure 2:
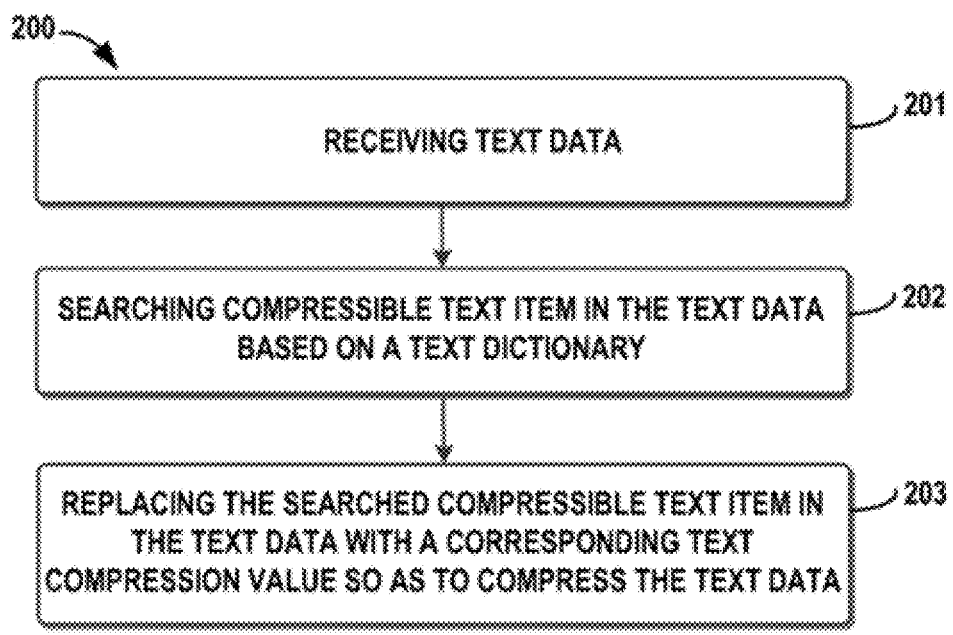
FIG. 2 schematically shows a flow diagram of a method for compressing text data according to one exemplary embodiment of the present disclosure.

Next, FIG. 2 will be referenced to describe a flow diagram of a method for compressing text data according to one embodiment of the present disclosure.

As shown in FIG. 2, in step 201, text data is received. Next, in step 202, a compressible text item is searched in the text data based on the text dictionary. Next, in step 203, a searched compressible text time in the text data is replaced with a corresponding text compression value so as to compress the text data.

In one embodiment, a text data for example may be log data from SaaS or other large-scale distribution system, which, may be in a form of text stream. In one embodiment, a text dictionary per se is a mapping structure, including key value pairs which represent correspondence relationships between text compression values and compressible text items. In a further embodiment, a compressible text item may refer to compressible text content in text data, e.g., statements, modes, or formats. In a further embodiment, a text compression value may be a text value after the compressible content is compressed. In a further embodiment, a length of a text compressible value may be shorter than a compressible text item, preferably much shorter than an original compressible text content, so as to enhance a compression ratio.

In one embodiment, a text dictionary may be built by an administrator familiar with an application system through manually entering key value pairs. In a further embodiment, a text dictionary may also be automatically built through extracting high-frequency information from massive sample text data. In an example embodiment, for an application running in a long term, many historical logs may already have been generated. In a further embodiment, these logs may be used as sample text data to generate a text dictionary. In a further embodiment, it may be also possible to directly use a text dictionary of other similar application that already runs.

In an example embodiment, a text item appearing frequently in sample text data and having a word length higher than a predetermined value (e.g., 3) may be first searched. In a further embodiment a corresponding weight may be determined based on a length of the text item and its appearing frequency. In a further embodiment, based on this weight, it may be determined which compressible text item(s) may be included in the text dictionary. In one embodiment, the weight, for example, may be determined as:

$$w=f*(\text{len}-\text{minNum})$$

wherein w denotes a weight corresponding to a text item; f denotes frequency of the text item appearing in the sample text data; len denotes a length of the text item; minNum denotes a predetermined value indicating a minimum length of the compressible text item.

In one embodiment, a number of a text dictionary may be limited as a predetermined value, e.g., 65535. In a further embodiment, text items having weights ranking top 65535 may be taken as searchable text items in the dictionary based on values of weight. In a further embodiment, corresponding key values may be generated for the searched text items according to any appropriate predetermined rule.

In a further embodiment, hereinafter, for illustration purposes, an example original text and an exemplary key value pairs may be generated based thereon will be illustrated in Table 1 and Table 2.

TABLE 1

Exemplary Original Text Content

<context id="cf77d61b-37fb-40cc-aab2-cdf621652f69" correlation="Get all children of object
type saas_beacon_checklistitem-339f12ed-8fac-4e3f-9e9b-52764c8fe550"
tenant="501c1e50-3e36-4d89-afde-ed7ef5f91b41"
subject="perfuser16@shngis.dctmlabs.com" status="200"desc="GET
/spaces/5601ad30-5df2-4e15-976a-244d1d150e2b/case-instance-nodes/b29821250f7241c2aaf TABLE 1-continued Exemplary Original Text Content 7983fd99ecdb f/case-instance-nodes/?page=1&items-per-page=5&inline=true" total="279 ms" begin="2014-08-27 09:26:24.808 UTC" end="2014-08-27 09:26:25.087UTC"">

In a further embodiment, an original text content as illustrated in Table 1 may include statements, modes, and format information. In a further embodiment, based on a large amount of text contents similar to an original text data shown in table 1, compressible text items may be determined through extracting contents appearing at high frequency. In a further embodiment, key value pairs may be generated through determining corresponding compression values for corresponding compressible texts, as shown in Table 2,

TABLE 2

Exemplary Key value Pairs

| Compression value | Compressible text items |
|---|---|
| {ctx} | <context id="String" correlation="String" tenant="String" subject="String" status="Number" desc="GET Url:case-instance-nodes" total="TIME:ms" begin="TIME:yyyy-MM-dd HH:mm:ss.SSS 'UTC'" end="TIME:yyyy-MM-dd HH:mm:ss.SSS 'UTC'"> |
| {u01} | GET spaces/String/case-instance-nodes/ String/case-instance-nodes/?page=Number & items-per-page=Number&inline=Boolean |
| {T01} | TIME:yyyy-MM-dd HH:mm:ss.SSS 'UTC' |
| $! | Get all childrens of object type saas_beacon_checklistitem - |
| $" | perfuser16@shngis.dctmlabs.com |

In a further embodiment, it may be seen from Table 2 that the length of a compression value may be far shorter than the length of a compressible text item, wherein the compression value, i.e., key value, may be formed by for example text characters, e.g., from any one or more of a group of upper-case letters, lower-case letters, symbols, numbers. In a further embodiment, text characters for example may include:

symbols: !"#$%&'( )*+,-./:;<=>?@\^'{ }~
numbers: 0 1 2 3 4 5 6 7 8 9
upper-caseletters:ABCDEFGHIJKLMNOPQRSTUVWXYZ
lower-caseletters:abcdefghijklmnopqrstuvwxyz In a further embodiment, in a log file usually encoded with the encoding format UTF-8, each of the above character may occupy 1 byte, which may ensure that each key value may occupy as small space as possible. In a further embodiment, in order to obtain a more optimal compression ratio, a shorter key value may be assigned to a compressible text item with a higher weight. In a further embodiment, a key value may also be defined or assigned by a system administrator, e.g., {cxt} shown in the above exemplary key value pair, which may be defined by the system administrator. In a further embodiment, a size of each text compression value may have a predetermined size, e.g., not exceeding 5 characters.

In a further embodiment, a large quantity of such key value pairs forms a text dictionary that may be used in text data compression. FIG. 3 shows an example of a part of a text dictionary. In this text dictionary, there includes a plurality of key value pairs indicating compression values and compressible text items, wherein the length of a compression value is significantly shorter than a length of a compressible text item.

In one embodiment, after a text dictionary is established, the text dictionary may be stored in a file system or stored in a permanent storage device such as a database, for future use.

In a further embodiment, logs with different types may usually have their own features in aspects of customary statements, modes, and formats. In a further embodiment, it is preferable to generate different text dictionaries for different types of text data. In an example embodiment, a text dictionary may be generated for a log recording user service behaviors, and a text dictionary may be generated for a log recording errors.

Return back to FIG. 1, in a further embodiment, after such a text dictionary is formed (in step 102), a compressible text item may be searched based on a text dictionary. In a further embodiment, a compression engine may search a compressible text item in text data based on a text dictionary, namely, search a compressible text item included in a text data and designated in the text dictionary. In a further embodiment, as previously mentioned, a compressible text item refers to repeated content frequently appearing in a text data, such as various kinds of standard statements, modes inherent to an employed programming language, and a format fixed to a text type, etc.

In a further embodiment, after the compressible text item in a text data is found (in step 103), a compression value in a text form corresponding to a found compressible text item may be used to replace a compressible text item in a text data. In a further embodiment, text data compression may be implemented through such replacement.

In a further embodiment, a compression engine for performing compression may operate in a pipeline manner. In a further embodiment, an original text output may be taken as its input, and its output may be a compressed text stream. In a further embodiment, a multi-thread processing may also be provided to enhance the throughput of the compression engine.

In an embodiment, for purpose of illustration, Table 3 exemplarily shows content resulting from compressing the exemplary original text data as shown in Table 1.

TABLE 3

Compressed Text Data

{ctx}|cf77d61b-37fb-40cc-aab2-cdf621652f69|$!339f12ed-8fac-4e3f-9e9b-52764c8fe550|
501c1e50-3e36-4d89-afde-ed7ef5f91b41|$"|200|{u01}|
5601ad30-5df2-4e15-976a-244d1d150e2b|b29821250f7241c2aaf7983fd99ecdbf|1|5|T|279|
2280384807|2280385086

As shown in Table 3, following the compression values such as {ctx} is its corresponding parameter values, e.g., "cf77d61b-37fb-40cc-aab2-cdf621652f69," "$!," etc., wherein some are text compression values, while some are original text values. It should be noted that the compressed text data shown in Table 3 is only a schematic example. In one embodiment, in actual application, an original text content which may not be a compression value in the above parameter values may also be parameterized into key value pairs to further enhance compression efficiency. In a further embodiment, parameter values such as "context id" may also be compressed to further achieve a higher compression ratio.

Figure 4:
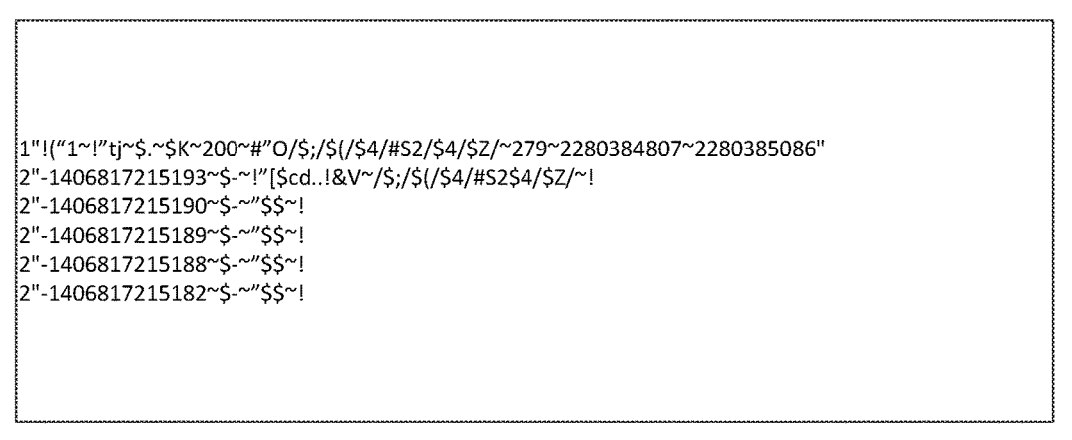

FIG. 4 schematically shows a text compression result having a higher compression ratio. It is seen from the compression result in in FIG. 4 that through further compressing the parameter values, the compression ratio may be significantly increased.

In one embodiment, in order to support updatability, it may perform version management on a text dictionary. In an example embodiment, each text dictionary may be labelled with version information, such that when it is required to update dictionary contents, a dictionary may be regenerated and also labeled with corresponding version information, e.g., version number. In a further embodiment, after a file is compressed using a text dictionary, the compressed text file may be labeled with version information identical to a text dictionary employed for compression. In a further embodiment, a corresponding text dictionary may be found upon decompression.

In a further embodiment, while performing a conditional query, a compression engine may also be used to compress query conditions in a query request so as to query a text data without decompression, and will be further described below.

Figure 5:
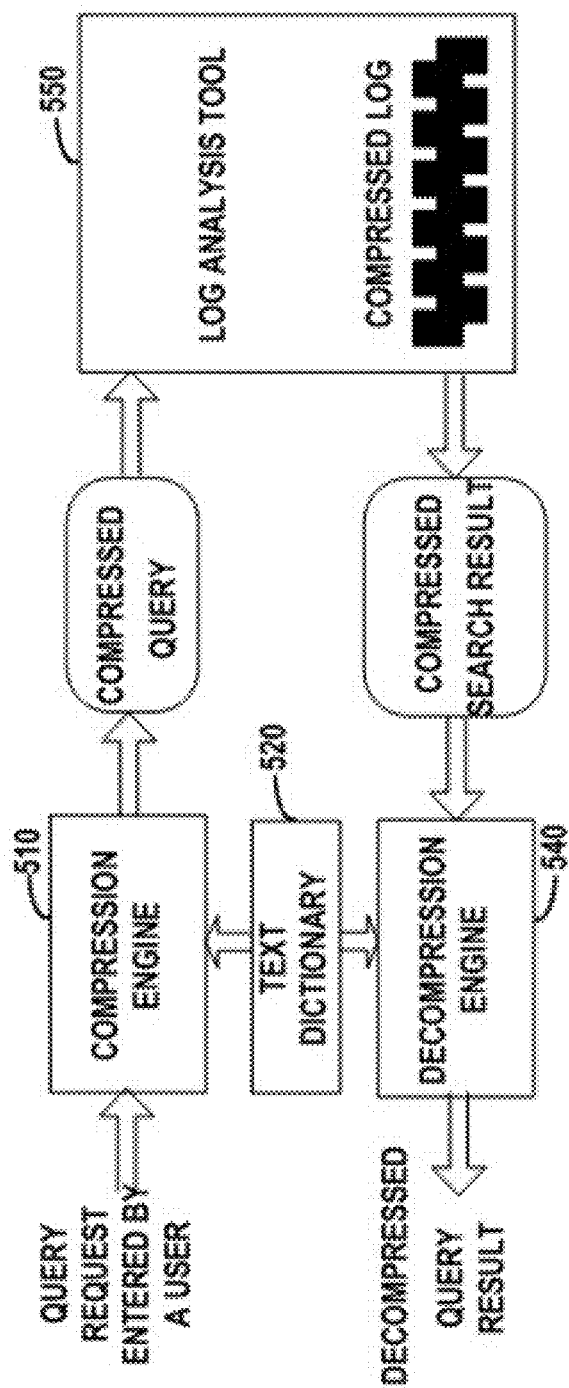
FIG. 5 schematically shows a block diagram of text data query and decompression according to one exemplary embodiment of the present disclosure.

FIG. 5 shows a block diagram for data query and decompression according to one exemplary embodiment of the present disclosure. As shown in FIG. 5, a query request entered by a user first enters in compression engine 510. Then, similar to the text data compression, compression engine 510 likewise searches a compressible text item (generally a query condition) in the query request based on text dictionary 520. Then, a corresponding text compression value is used to replace the compressible text item. This means that the query entered into log analysis tool 550 is a compressed query. Because the query condition per se is also compressed, while the compression text data per se is also in a searchable text form including a text compression value, the query operation may be directly performed without decompressing the log file.

For example, if a user enters "Big Data" as a query condition in a query input component of log query tool 550, then compression engine 510 will compress the query condition using a text dictionary corresponding to the type and version information of the compressed file which the text search request is directed towards. In other words, the system will search a text compression value e.g., "Big$@,", which matches with the query condition in text dictionary 520, and using a corresponding text compression value "Big$@" replaces the query condition. Additionally, if "Big Data" is included in the value of the keyword "$d," then the "$d" will be processed as another query condition. Log analysis tool 550 will perform text content search using the compressed condition.

After the search is completed, log analysis tool 550 will return a result obtained from performing the search. The search result is in a compressed form, e.g., the result includes compressed text data like data of "$A$a$d, Big$@, $c$mIT."

Decompression engine 540 will perform decompression with respect to the query result in a compressed form. Similarly, based on text dictionary 520, a text compression value is searched from the query result in a compressed form, and then the text compression value is replaced with a corresponding compressible text item. After the decompression is completed, the decompressed query result may be returned to the user for viewing. The decompressed query result may be, for example, "EMC-Leading Cloud computing, Big Data and Trusted IT."

Hereinafter, for the purpose of illustration, a method for decompressing compressed text data according to one exemplary embodiment of the present disclosure will be described with reference to FIG. 6.

Figure 6:
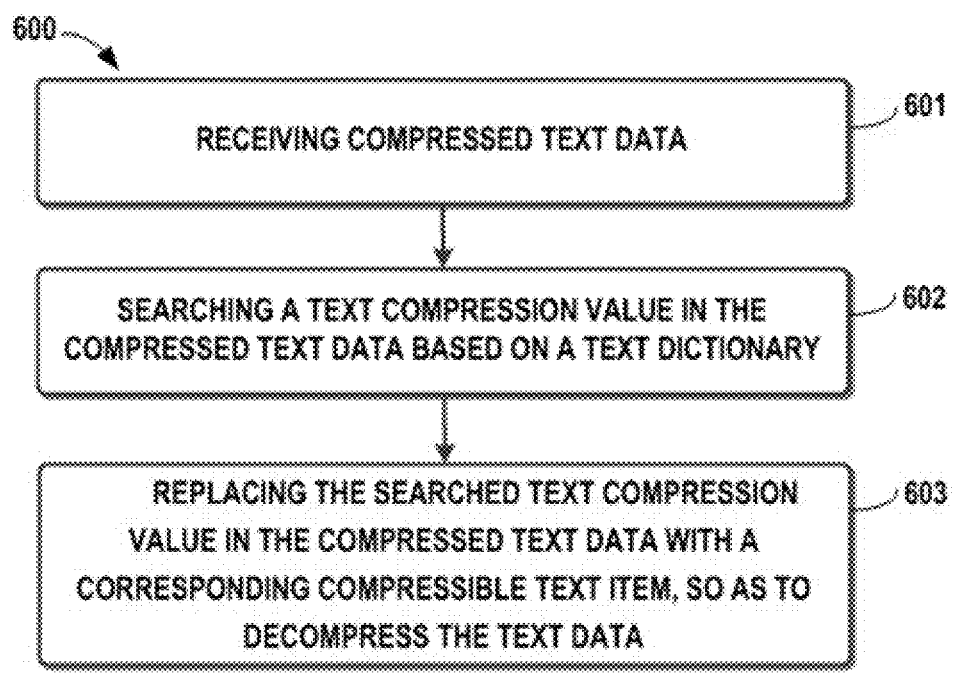
FIG. 6 schematically shows a flow diagram of a method for decompressing compressed text data according to one exemplary embodiment of the present disclosure.

As shown in FIG. 6, first in step 601, compressed text data is received. The text data for example is a query result from analyzing, which may also be compressed text data from other data source. Then, in step 602, a text compression value in the compressed text data may be searched based on a text dictionary. After the text compression value is found based on the text dictionary, the text compression value in the searched compressed text data is replaced with a compressible text item in the text dictionary in step 603, thereby decompressing the compressed text data.

In one embodiment, a text dictionary may include a plurality of key-value pairs as mentioned above, each of which includes a text compression value and a corresponding compressible text item. In a further embodiment, a text compression value may have a length shorter than a compressible text item. In a further embodiment, a text dictionary may be an abovementioned text dictionary employed when performing compression. In a further embodiment, a text dictionary may be established through extracting high-frequency appearance information from a plurality of sample text data. In a further embodiment, a compressible text item may include one or more of statements frequently appearing in a text data, a mode inherent to the used programming language, or a format fixed to a text type. In a further embodiment, a compressible text item included in the key-value pair may have a length larger than a predetermined value. In a further embodiment, a text compression value included in a key value pair of the text dictionary may include any one of upper-case letters, lower-case letters, numbers and symbols or a combination thereof. In a further embodiment, a length of a text compression value usually may not exceed a predetermined value. In a further embodiment, a text dictionary may have a predetermined length, so as to achieve a predetermined compression ratio. In a further embodiment, a compressible text item in a text dictionary may be determined based on a weight of a text item. In a further embodiment, a weight of a text item for example may be determined at least based on a length of a text item and its appearing frequency. In a further embodiment, original text data may be recovered through the above decompression process and can be provided to the user for viewing.

In a further embodiment, various kinds of searches may be performed without performing decompression. In a further embodiment, for example, it may support full-word search with a wildcard character, and support comparison functions in terms of date, time, and number. In a further embodiment, it may also support query for a specific file mode and format, which, for example, may be used to effectively enhance query efficiency, particularly for a regional query (such as query within a specific time period).

Therefore, in an embodiment of the present disclosure, there is provided an improved solution for compressing and decompressing text data. In a further embodiment, text compression may be performed by a compressible text item in a text data that may be replaced with a corresponding text compression value, instead of using an unsearchable binary compression manner. In a further embodiment, not only a desired compression ratio may be achieved, but also a compressed content per se may still be in a searchable text form. In a further embodiment, when performing query, a compressible text item in a query request may be likewise compressed into a text compression value with which a compressed file may be searched without decompressing the compressed file. In a further embodiment, storage space may be significantly saved and search efficiency may be greatly enhanced. In a further embodiment, the technical solution presented herein may not only reduce total cost ownership (TCO), but may also provide a better experience to a user.

Figure 7:
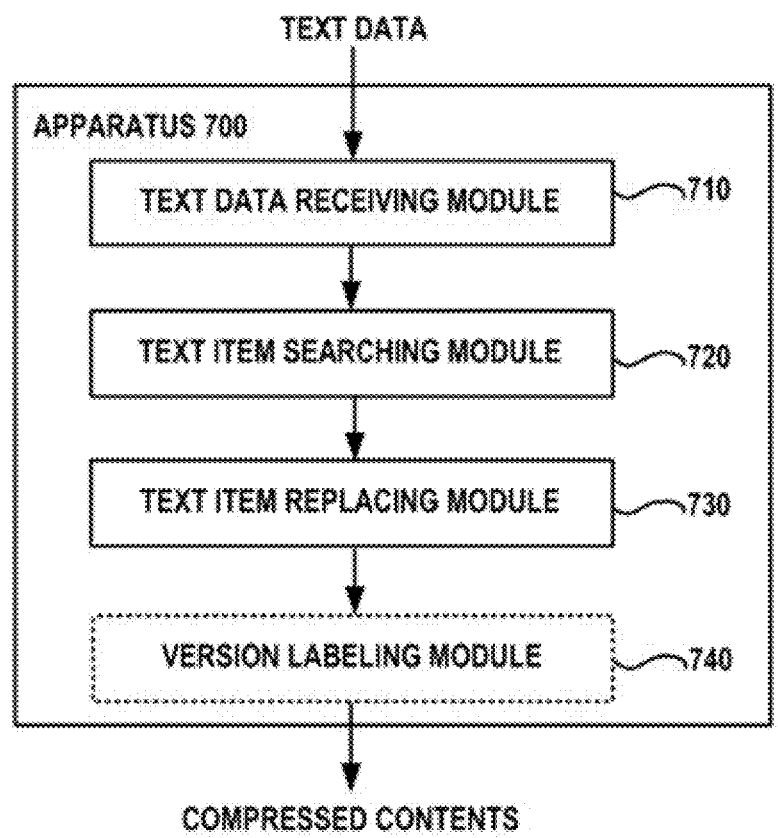
FIG. 7 schematically shows a block diagram of an apparatus for compressing text data according to one exemplary embodiment of the present disclosure.

FIG. 7 shows a block diagram of an apparatus for compressing text data according to one exemplary embodiment of the present disclosure. As shown in FIG. 7, apparatus 700 for compressing text data may comprise: text data receiving module 710, text item searching module 720, and text item replacing module 730. In particular, text data receiving module 710 is configured to receive text data. Text item searching module 720 is configured to search a compressible text item in the text data based on a text dictionary. The text dictionary includes a plurality of key value pairs, each of which includes a text compression value and a corresponding compressible text items, and the text compression value has a length shorter than the compressible text item. Text item replacing module 730 is configured to replace the searched compressible text item in the text data with the corresponding text compression value so as to compress the text data.

In one embodiment, text dictionary may be selected from a plurality of text dictionaries corresponding to a plurality of different types of text data based on a type of the text data. In a further embodiment, text dictionary may have version information. In this case, apparatus may further comprise: version labeling module 740 that may be configured to label the compressed text data with compression version information identical to the version information of the text dictionary.

In a further embodiment, text dictionary may be established by extracting high-frequency appearance information from a plurality of sample text data. In a further embodiment, a text dictionary may have a predetermined size. In a further embodiment, a compressible text item in a text dictionary may be determined based on a weight of a text item. In a further embodiment, weight of a text item may be determined at least based on a length of a text item and its appearing frequency.

Figure 8:
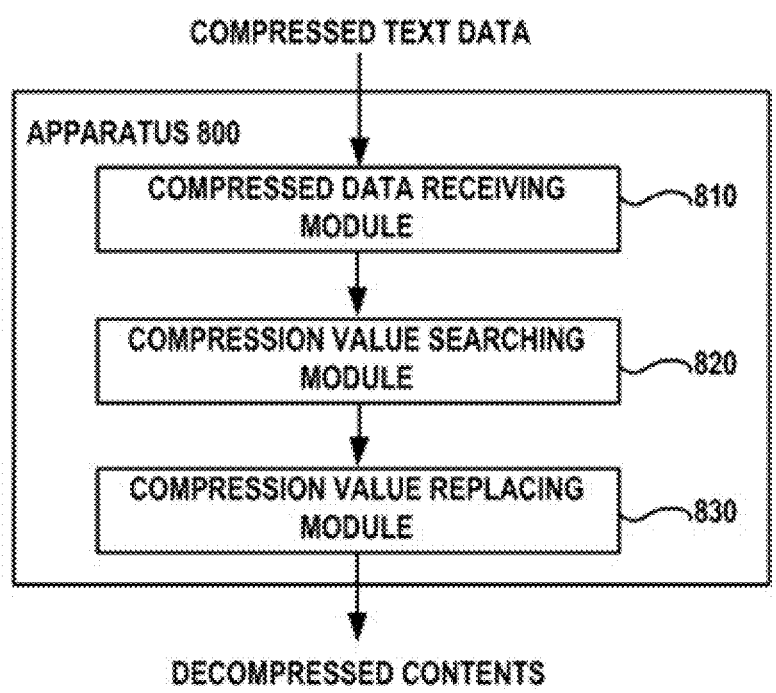
FIG. 8 schematically shows a block diagram of an apparatus for decompressing text data according to one exemplary embodiment of the present disclosure.

FIG. 8 illustrates shows a block diagram of an apparatus for decompressing text data according to one exemplary embodiment of the present disclosure. As shown in FIG. 8, apparatus 800 for decompressing a compressed text data may comprise: compressed data receiving module 810, compression value searching module 820, and compression value replacing module 830. In particular, compressed data receiving module 810 may be configured to receive compressed text data. Compression value searching module 820 may be configured to search a text compression value in the compressed text data based on a text dictionary. The text dictionary includes a plurality of key value pairs, each of which includes a text compressed value and a corresponding compressible text item, and the text compression value has a length shorter than the compressible text item. Compression value replacing module 830 may be configured to replace the searched text compression value in the compressed text data with a corresponding compressible text item, so as to decompress the text data. In one embodiment, text dictionary may be selected from among a plurality of text dictionaries corresponding to different types of text data and version information. In a further embodiment, text dictionary, for example, may be established through extracting high-frequency appearing information from a plurality of sample text data. In a further embodiment, text dictionary may have a predetermined size, and a compressible text item in a text dictionary may be determined based on a weight of the text item. In a further embodiment, weight of a text item for example may be determined at least based on a length of a text item and its appearance frequency.

It should be noted that for a purpose of simplification, operations of various components of apparatuses 700 and 800 are described briefly above. For details of operations of these components, one may refer to relevant parts in the detailed description of the methods with reference to FIGS. 1-6.

Besides, it should be noted that the compression solution of the present disclosure may also be implemented through a computer program product. In one embodiment, the computer program may include program code embodied thereon. In a further embodiment, the program code, when being executed on a processor, may cause the processor to perform a method for compressing text data according to the present disclosure.

Additionally, it should also be noted that the decompression solution of the present disclosure may also be implemented through a computer program product. In one embodiment, computer program may include program code embodied thereon. In a further embodiment, the program code, when being executed on a processor, may cause the processor to perform a method for decompressing text data according to the present disclosure.

Figure 9:
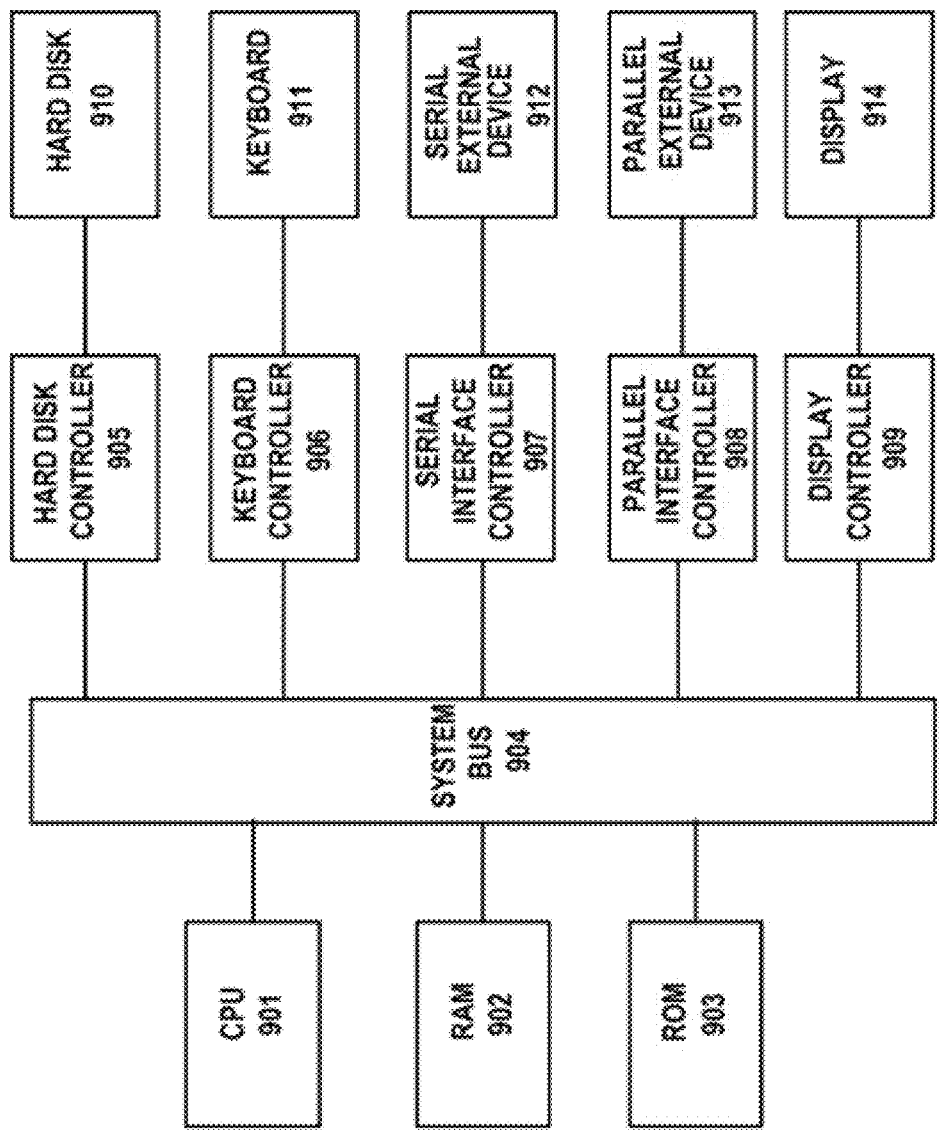
FIG. 9 schematically shows a structural block diagram of an exemplary computer device in which the embodiments according to the present disclosure may be implemented.

Hereinafter, reference will be made to FIG. 9 to describe a computing device in which the embodiments of the present disclosure may be implemented. FIG. 9 schematically shows a structural block diagram of a computer device that may implement the embodiments according to the present disclosure.

As shown in FIG. 9, the computer system comprises CPU (Central Processing Unit) 901, RAM (Random Access Memory) 902, ROM (Read Only Memory) 903, system bus 904, hard disk controller 905, keyboard controller 906, serial interface controller 907, parallel interface controller 908, display controller 909, hard disk 910, keyboard 911, serial peripheral device 912, parallel peripheral device 913 and display monitor 914. Among these components, connected to system bus 904 are CPU 901, RAM 902, ROM 903, hard disk controller 905, keyboard controller 906, serial interface controller 907, parallel controller 908 and display controller 909. Hard disk 910 is connected to hard disk controller 905; keyboard 911 is connected to keyboard controller 906; serial peripheral device 912 is connected to serial interface controller 907; parallel peripheral device 913 is connected to parallel interface controller 908; and monitor 914 is connected to monitor controller 909. It should be understood that the structural block diagram in FIG. 9 is illustrated only for illustration purpose, and is not intended to limit the invention. In some cases, some devices can be added or reduced as required.

The embodiments of the present disclosure may be stored in a storage device like hard disk 910 of the above computer as computer program code, so as to cause CPU 901 to perform the methods for compression and decompression according to the present disclosure.

It should be noted that the embodiments of the present disclosure may be by software and/or combination of software and hardware. Although the compression and decompression solutions provided by the present disclosure have been described above through embodiments in conjunction with the drawings, those skilled in the art should understand that although the text data is described with a log in a text stream form, the present disclosure is not only limited to log data; and, any other appropriate text data may be compressed adopting the solution of the present disclosure; besides, the text data is not necessarily in a form of file stream. Additionally, the above description uses a distribution system or SaaS an example. However, the present disclosure may also be applied to other similar scenarios. Further, the weight calculation as illustrated above is also exemplary. In actual application, the weight may also be calculated in different manners, e.g., adopting a different algorithm, considering more or less factors, etc. Additionally, it may also be understood that based on the disclosure and teaching here, those skilled in the art may also contemplate various modifications, alterations, replacements or equivalents without departing from the spirit and scope of the present disclosure. These modifications, alterations, replacements or equivalents are all included within the scope of the present disclosure only limited in the claims.

The present disclosure may be implemented in a combined body, e.g., implemented using an application-specific integrated circuit (ASIC), a general-purpose computer or any other similar hardware device. In one embodiment, the software program of the present disclosure may be executed by a processor to implement the above steps or functions. Likewise, the software program (including relevant data structure) of the present disclosure may be stored in a computer readable recording medium, e.g., a RAM memory, a magnetic or optical driver or a floppy disk and a similar device. Additionally, some steps or functions of the present disclosure may be implemented using hardware, e.g., as a circuit cooperating with the processor to perform various steps or functions.

Additionally, a part of the present disclosure may be applied as a computer program product, e.g., computer program instruction, which, when being executed by the computer, may invoke or provide a method and/or technical solution according to the present disclosure through an operation of the computer. However, the program instruction invoking the methods of the present disclosure may be stored in a fixed or mobile recording medium, and/or transmitted through broadcast or a data stream in other signal carrier media, and/or stored in a work memory of a computer device running according to the program instruction. Here, one embodiment according to the present disclosure comprises an apparatus comprising a memory for storing a computer program instruction and a processor for executing a program instruction, wherein the computer program instruction, when being executed by the processor, triggers the apparatus to run methods and/or technical solutions based on the above mentioned plurality of embodiments of the present disclosure.

To those skilled in the art, it is apparent that the present disclosure is not limited to the details of the above exemplary embodiments; instead the present disclosure may be implemented with other forms without departing from the spirit or basic features of the present disclosure. Thus, in any way, the embodiments should be regarded as exemplary, not limitative; the scope of the present disclosure is limited by the appended claims, instead of the above depiction. Thus, all variations intended to fall into the meaning and scope of equivalent elements of the claims should be covered within the present disclosure. No reference signs in the claims should be regarded as limiting the involved claims. Besides, it is apparent that the term "comprise/comprising/include/including" does not exclude other units or steps, and singularity does not exclude plurality. A plurality of units or means stated in the apparatus claims may also be implemented by a single unit or means through software or hardware. Terms such as the first and the second are used to indicate names, but do not indicate any particular sequence.

What is claimed is:

1. A method for compressing and searching text data, the method comprising:
   building a text dictionary including a plurality of key value pairs, each of which includes a text compression value and a corresponding compressible text item, wherein the text compression value has a length shorter than the compressible text item, wherein building the text dictionary includes:
      searching a set of sample text data previously generated by a particular application for text patterns that exceed a predetermined threshold length (MinNum) and that appear in the set of sample text data at least a predetermined threshold number of times, yielding a set of eligible text patterns;
      assigning a weight to each text pattern in the set of eligible text patterns by multiplying a number of times (f) that that text pattern appears in the set of sample text data by a difference between a length of that text pattern (len) and the predetermined threshold length (MinNum);
      selecting, as the compressible text items included within the text dictionary, the text patterns of the set of eligible text patterns that have the N highest assigned weights, wherein N represents a maximum number of key value pairs allowed in the text dictionary; and
      assigning version information to the text dictionary;
   receiving a text data stream at a compression engine from the particular application;
   searching for a compressible text item in the text data stream based on the text dictionary;
   creating a compression log by replacing the compressible text item searched in the text data stream with a corresponding text compression value, so as to compress the text data stream;
   labelling the compression log with compression version information identical to version information of the text dictionary;
   after creating the compression log, receiving an uncompressed query term from a user at the compression engine;
   compressing, by the compression engine, the uncompressed query term with reference to the text dictionary to yield a compressed query value smaller than the uncompressed query term;
   searching for the compressed query value within the compression log without performing decompression on the compression log, yielding a search result in compressed form;
   decompressing the search result with reference to the text dictionary to yield an uncompressed search query result; and
   returning the uncompressed search query result to the user, the uncompressed search query result including an instance of the uncompressed query term within the text data stream.

2. The method according to claim 1, further comprising adding a new compressible text item to the text dictionary if the new compressible text item appears in the text data stream more than a threshold number of times.

3. The method according to claim 2, wherein the new compressible text item further comprises one or more of a statement appearing more than a threshold number of times in the text data, a pattern inherent to a programming language used, and a fixed format for a text type.

4. The method according to claim 1, wherein the text dictionary has a predetermined size, and wherein a compressible text item in the text dictionary is determined based on a weight of the text item which is determined at least based on a length of the text item and a threshold value.

5. The method according to claim 1, wherein the text data stream is a log data in a form of text stream.

6. The method of claim 1 wherein the maximum number of key value pairs allowed in the text dictionary is 65535.

7. The method of claim 1 wherein the predetermined threshold length (MinNum) is three.

8. A non-transitory computer program product for compressing and searching text data, the computer program product comprising a non-transitory medium having computer executable instructions stored thereon configured to cause a computer to:

build a text dictionary including a plurality of key value pairs, each of which includes a text compression value and a corresponding compressible text item, wherein the text compression value has a length shorter than the compressible text item, wherein building the text dictionary includes:

searching a set of sample text data previously generated by a particular application for text patterns that exceed a predetermined threshold length (MinNum) and that appear in the set of sample text data at least a predetermined threshold number of times, yielding a set of eligible text patterns;

assigning a weight to each text pattern in the set of eligible text patterns by multiplying a number of times (f) that that text pattern appears in the set of sample text data by a difference between a length of that text pattern (len) and the predetermined threshold length (MinNum);

selecting, as the compressible text items included within the text dictionary, the text patterns of the set of eligible text patterns that have the N highest assigned weights, wherein N represents a maximum number of key value pairs allowed in the text dictionary; and assigning version information to the text dictionary;

receive a text data stream at a compression engine from the particular application;

search for a compressible text item in the text data stream based on the text dictionary;

create a compression log by replacing the compressible text item searched in the text data stream with the corresponding text compression value, so as to compress the text data;

labelling the compression log with compression version information identical to version information of the text dictionary;

after creating the compression log, receive an uncompressed query term from a user at the compression engine;

compress, by the compression engine, the uncompressed query term with reference to the text dictionary to yield a compressed query value smaller than the uncompressed query term;

search for the compressed query value within the compression log without performing decompression on the compression log, yielding a search result in compressed form;

decompress the search result with reference to the text dictionary to yield an uncompressed search query result; and return the uncompressed search query result to the user, the uncompressed search query result including an instance of the uncompressed query term within the text data stream.

9. The computer program product of claim 8 wherein the maximum number of key value pairs allowed in the text dictionary is 65535.

10. The computer program product of claim 8 wherein the predetermined threshold length (MinNum) is three.

* * * * *